(12) United States Patent
McTague et al.

(10) Patent No.: US 6,282,594 B1
(45) Date of Patent: Aug. 28, 2001

(54) PALLET, SYSTEM AND METHOD FOR USE IN TESTING AND/OR INSTALLING SOFTWARE ONTO A PERSONAL COMPUTER SYSTEM UNIT

(75) Inventors: Michael McTague, Limerick; Edward O'Shea, Carraig-na-Var, both of (IE)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/173,230

(22) Filed: Oct. 15, 1998

(51) Int. Cl.[7] .................................. G06F 1/16; H05K 5/02
(52) U.S. Cl. .................................. 710/101; 361/683
(58) Field of Search .............................. 717/11; 710/101, 710/102, 103; 361/683, 686

(56) References Cited

U.S. PATENT DOCUMENTS

| | | |
|---|---|---|
| 4,667,094 | 5/1987 | Van-Hecke et al. . |
| 5,434,775 | 7/1995 | Sims et al. . |
| 5,818,691 * | 10/1998 | McMahan et al. .................. 361/686 |
| 5,963,743 * | 10/1999 | Amberg et al. ....................... 717/11 |
| 5,991,543 * | 11/1999 | Amberg et al. ....................... 717/11 |
| 5,991,838 * | 11/1999 | Swindler et al. .................... 710/101 |
| 5,995,757 * | 11/1999 | Amberg et al. ....................... 717/11 |

FOREIGN PATENT DOCUMENTS 0 398 030   11/1990   (EP) .

* cited by examiner

Primary Examiner—Glenn A. Auve
(74) Attorney, Agent, or Firm—Haynes and Boone, L.L.P.

(57) ABSTRACT

A system for use in testing and/or installing software onto a personal computer system unit includes a pallet for supporting the system unit and a rack having at least one docking station for removably accommodating the pallet. The pallet has data and power sockets for the system unit and a set of data and power contacts each connected to a respective contact in one of the data and power connectors. The docking station has a complementary set of data and power contacts adapted for one-to-one engagement with the set of data and power contacts of the pallet when the pallet is located in the docking station.

18 Claims, 4 Drawing Sheets

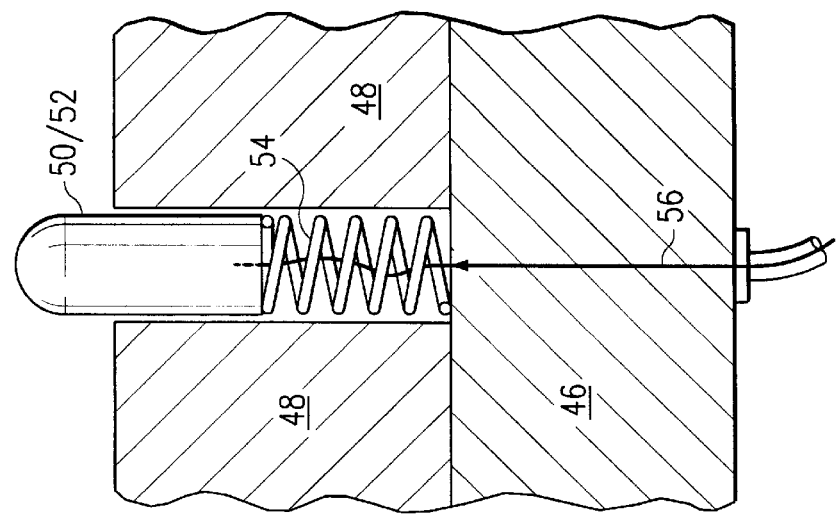
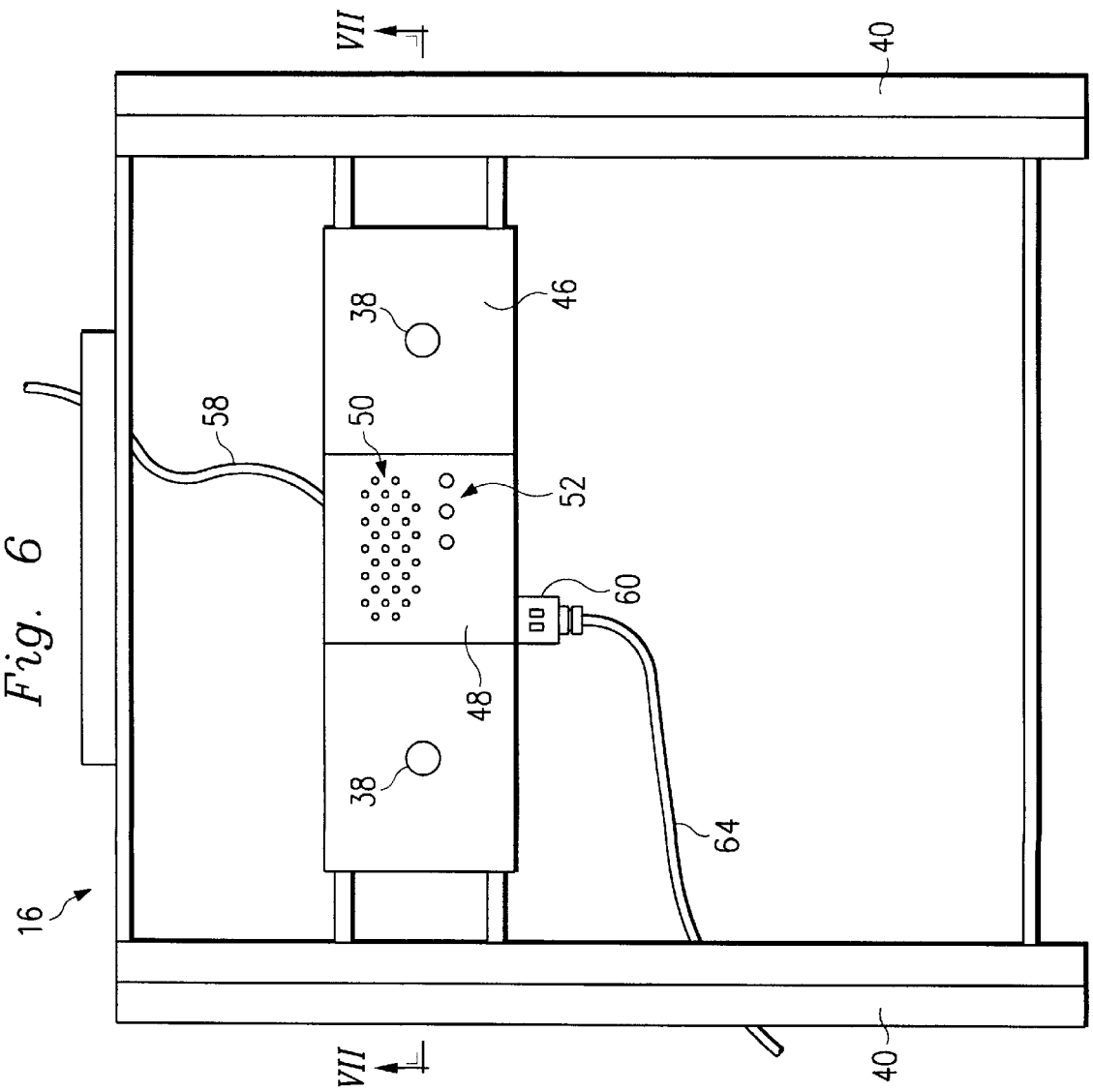

PALLET, SYSTEM AND METHOD FOR USE IN TESTING AND/OR INSTALLING SOFTWARE ONTO A PERSONAL COMPUTER SYSTEM UNIT

BACKGROUND

This invention relates to a pallet, system and method for use in testing and/or installing software onto a personal computer (PC) system unit.

This application relates to U.S. application Ser. No. 08/919,959, filed on Aug. 29, 1997, now U.S. Pat. No. 5,995,757, entitled Software Installation and Testing For A Build-To-Order Computer System, naming Richard D. Amberg, Roger W. Wong and Michael A. Brundridge, as inventors. The application is incorporated herein by reference in its entirety, and is assigned to the assignee of this invention.

This application relates to U.S. patent application Ser. No. 08/921,438, filed on Aug. 29, 1997, now U.S. Pat. No. 5,963,743, entitled Database For Facilitating Software Installation And Testing For A Build-To-Order Computer System, naming Richard D. Amberg, Roger W. Wong and Michael A. Brundridge as inventors. The co-pending application is incorporated herein by reference in its entirety, and is assigned to the assignee of this invention.

This application relates to co-pending U.S. patent application Ser. No. 09/150,800, filed on Sep. 10, 1998, entitled Automatic Location Determination of Devices Under Test, naming Subhashini Rajan and Robert W. Wong as inventors. The co-pending application is incorporated by reference in its entirety, and is assigned to the assignee of this invention.

This application relates to co-pending U.S. patent application Ser. No. 09/177,420, filed on Oct. 22, 1998, entitled Troubleshooting Computer Systems During Manufacturing Using State and Attribute Information, naming Subhashini Rajan, Robert W. Wong and Richard D. Amberg as inventors. The co-pending application is incorporated herein by reference in its entirety, and is assigned to the assignee of this invention.

The final stages of the manufacture of a PC with pre-loaded software require the software to be downloaded onto the PC system unit and for the PC system unit to be extensively tested. At present, the requirement for operator access to connect power and data (parallel port) connectors to the PC system unit imposes a height limit on the rack used to accommodate the PC system unit during these operations. As, typically, many PC system units are tested and have their software installed at the same time, a large amount of floor space is taken up by these units.

Therefore, what is needed is to provide a pallet, system and method for use in testing and/or installing software onto a PC system unit which will allow the units to be placed on a rack at a height out of the normal reach of the operator so that a more effective use of floor space can be achieved.

SUMMARY

One embodiment, accordingly, provides a system for use in testing and/or installing software onto a personal computer system unit. To this end, a pallet is provided for a personal computer system unit which is to be tested and/or onto which software is to be installed. The pallet has data and power connectors for the system unit and a set of data and power contacts each connected to a respective contact in one of the data and power connectors. The set of data and power contacts are adapted for one-to-one engagement with a complementary set of data and power contacts on a rack upon which the pallet may be located.

A principal advantage of this embodiment is that it allows the operator to connect both power and data connections from the computer directly to connections on the pallet. An elevator is then used to locate the pallet into a docking station elevated above the floor. When the pallet is located in the docking station, power and data connection are automatically made with main power and server, respectively.

BRIEF DESCRIPTION OF THE DRAWINGS

FIG. 6 is a plan view from above of an embodiment of a pallet docking station on the rack.

FIG. 8 is a sectional elevation of one of the contact pins of FIG. 7.

DETAILED DESCRIPTION

Figure 1:
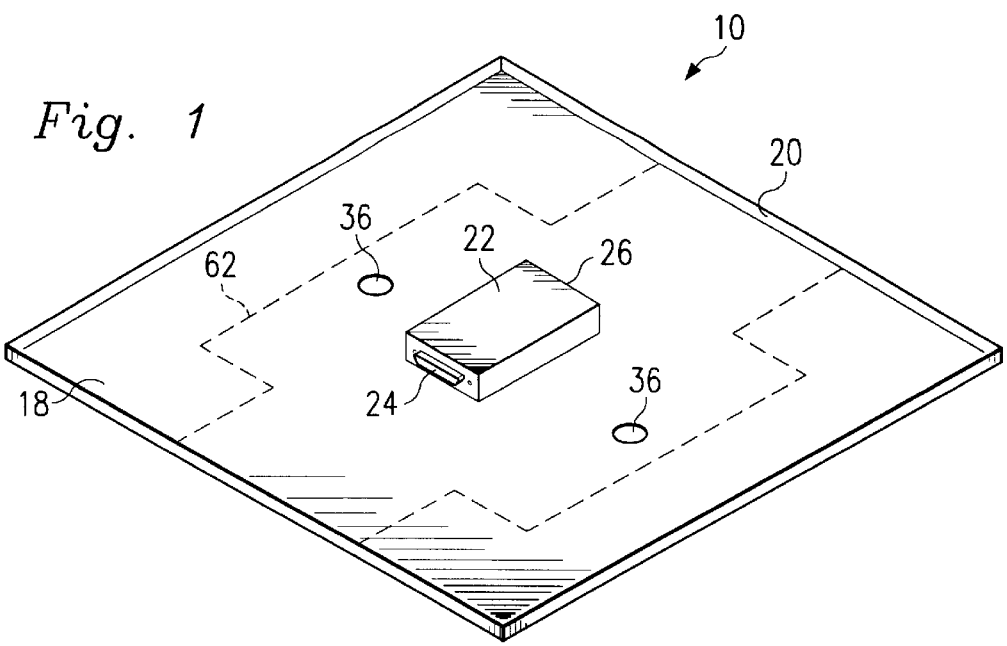
FIG. 1 is a top perspective view illustrating an embodiment of a pallet.
Figure 2:
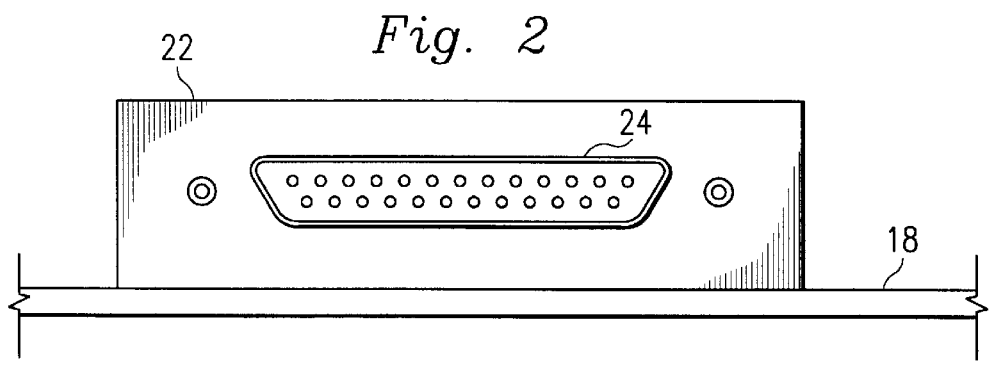
FIG. 2 is a front elevation of an embodiment of the socket box mounted on the pallet.
Figure 3:
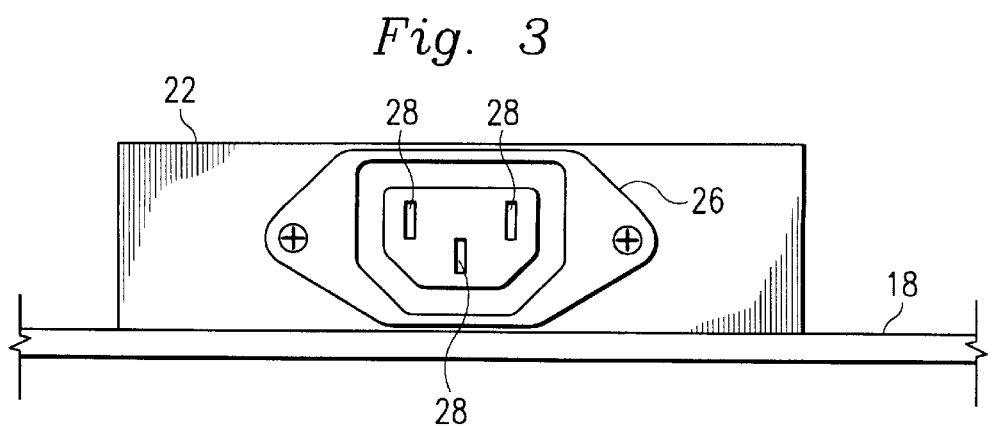
FIG. 3 is a rear elevation of an embodiment of the socket box.
Figure 4:
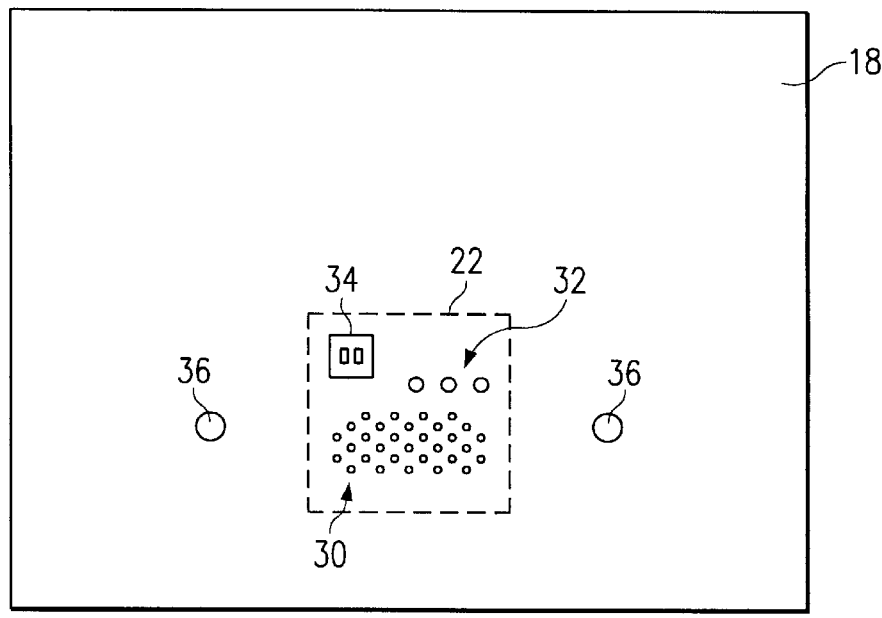
FIG. 4 is a plan view from below of an embodiment of the pallet.
Figure 5:
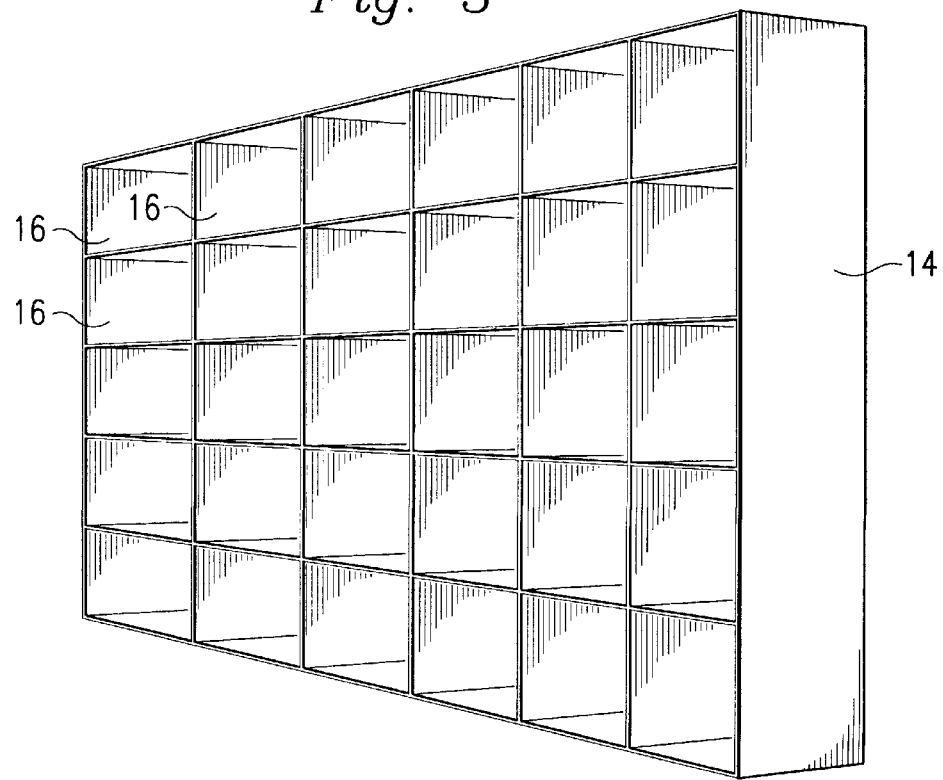
FIG. 5 is a schematic perspective view of an embodiment of a rack for removably accommodating a plurality of pallets.

A system for use in testing and/or installing software onto PC system units includes a plurality of pallets 10, of which only one is shown in FIG. 1, each for supporting a respective PC system unit 12 (FIG. 7), and a rack 14 (FIG. 5) having a plurality of pallet docking stations 16 each for removably accommodating a respective pallet and PC. The docking stations 16 are arranged in the rack 14 in a two-dimensional matrix of rows and columns and extend, in the vertical direction substantially above the height of human operators.

Referring primarily to FIGS. 1 to 4, each pallet 10 is in the form of a shallow tray having a base 18 and upturned sidewalls 20. A socket box 22 is fixed to the base 18, and has a standard 25-pin parallel port "D" data socket 24 at one end and a standard IEC power socket 26 at the other end having respective live, neutral and ground contacts 28.

Fixed in the base 18 and exposed on the underside of the pallet 10, there are a set of downward-facing electrical contacts comprising twenty-five data contacts 30 and three power contacts 32, all mutually insulated from one another. Internally of the socket box 22 each of the three power contacts 32 is electrically connected to a respective one of the live neutral and ground contacts 28 of the power socket 26 and each of the twenty-five data contacts 30 is electrically connected to a respective one of the contact pins of the parallel port data socket 24. A microswitch actuator 34 is also fixed to the underside of the base 18, for a purpose to be described later. Finally the base 18 has a pair of locating holes 36 for cooperation with a pair of guide pins 38 (FIG. 7) on each docking station 16.

Figure 7:
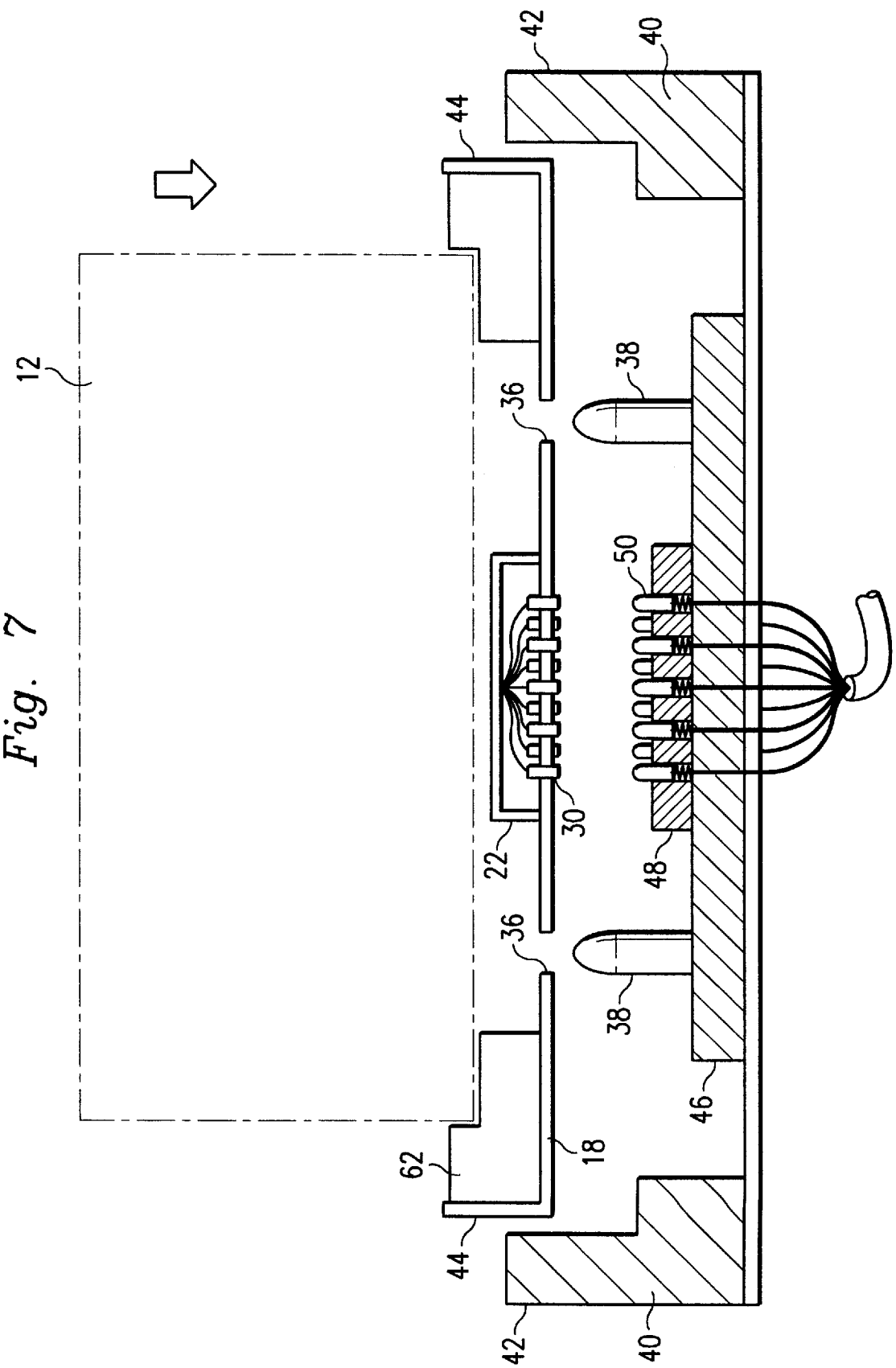
FIG. 7 is a sectional elevation of the docking station of FIG. 6 taken along the line VII-VIII and further showing a pallet being lowered into the docking station.

Referring now also to FIGS. 5 to 8, each docking station 16 in the rack 14 comprises a pair of opposite parallel side rails 40 with upstanding edges 42 for receiving and supporting a pallet 10 by its opposite parallel edges 44, FIG. 7. A cross-member 46 fixed between the rails 40, supports a contact block 48, the latter carrying a set of upward-facing electrical contact pins comprising twenty-five data contact pins 50 and three power contact pins 52 all mutually insulated from one another. The cross-member 46 also carries the guide pins 38 and a microswitch 60.

Each contact pin 50, 52 is spring-located by a respective spring 54, FIG. 8, so that it projects above the contact block 48 but can be pushed downwardly into the block against the bias of the spring 54. The set of contact pins 50, 52 are located in a complementary mirror-image arrangement to the set of contacts 30, 32, exposed on the underside of the pallet 10. Each contact pin 50, 52 is electrically connected to a respective electrical conductor 56, FIG. 8, and all the conductors 56 from the docking station are brought together into a multi-core cable 58, FIG. 6, leading to a master data/power control box (not shown) positioned on the rack at a location accessible to a human operator.

In use, a PC system unit 12, FIG. 7, having a power socket and a parallel port data socket, is placed on the pallet 10 on a sheet of foam material 62 which supports the PC system unit just above the socket box 22 (the approximate extent of the foam material is indicated in dashed lines in FIG. 1). A power lead (not shown) is then connected between the power socket 26 on the socket box 22 and the power socket on the PC system unit 12, and a data cable (also not shown) is likewise connected between the parallel port data socket on the PC system unit.

Next, the pallet is placed in one of the docking stations 16. This may be accomplished by designing the rack 14 as an automated storage and retrieval system of the kind used in automated warehouses, where a robotic handler (not shown) can be controlled to move a pallet to any selected docking station 16 in the rack and lower it onto the respective rails 40. Such systems are well known and do not require further description here.

In any event, whatever system is used, the pallet 10 containing the PC system unit 12 is lowered onto the rails 40. As the pallet 10 is lowered, the guide pins 38 enter the locating holes 36 in the base 18 of the pallet so that the pallet is brought to a precisely defined pre-determined position in the docking station 16 whereby the set of contacts 30, 32 on the pallet are brought automatically into registering one-to-one engagement with the complementary set of contact pins 50, 52 of the docking station. The spring-loading of each contact pin 50, 52 allows each pin to be pushed down slightly into the block 48 against its spring bias by engagement with the corresponding one of the contacts 30 or 32 on the pallet, both to ensure that a good pressure contact is made between the contact pin 50 or 52 and the corresponding contact 30 and 32, and to accommodate manufacturing tolerances.

In order to ensure that power cannot be supplied to the contact pins 52 before the contact pins 50 and 52 are properly engaged with the corresponding contacts 30 and 32, which will prevent arcing, the microswitch 60 is positioned on the docking station 16 for actuation by the actuator 34 on the pallet base 18 only as the pallet finally comes to rest on the rails 40, after the sets of contacts 30, 32 and 50, 52 have engaged. The microswitch 60 is connected via a cable 64 to a power control unit (not shown) which enables power supply to the power contacts 52 of the docking station 16 only when the microswitch has been actuated.

Having now properly seated the pallet 10 in the docking station 16 with both sets of contacts 30, 32 and 50, 52 properly engaged, the PC system unit 12 is now tested, and/or software is installed on it, by supplying power to the unit via the power contacts 52 of the docking station and supplying test data and/or program data to the unit via the data contacts 50 of the docking station. Finally, when all testing and software downloading is complete, the pallet 10 containing the system unit 12 may be removed from the rack 14.

As a result, one embodiment provides a pallet for a personal computer system unit which is to be tested and/or onto which software is to be installed, the pallet having data and power connectors for the system unit and a set of data and power contacts each connected to a respective contact in one of the data and power connectors, the set of data and power contacts being adapted for one-to-one engagement with a complementary set of data and power contacts on a rack upon which the pallet may be located.

Another embodiment provides a system for use in testing and/or installing software onto a personal computer system unit, the system including a pallet for the system unit and a rack having at least one pallet receiving station for removably accommodating the pallet, wherein the pallet has data and power connectors for the system unit and a set of data and power contacts each connected to a respective contact in one of the data and power connectors, and wherein the pallet-receiving station has a complementary set of data and power contacts adapted for one-to-one engagement with the set of data and power contacts of the pallet when the pallet is located in the pallet receiving station.

A further embodiment provides a method of testing and/or installing software onto a personal computer system unit, the method including placing the system unit onto a pallet having data and power connectors for the system unit and a set of data and power contacts each connected to a respective contact in one of the data and power connectors, connecting the system unit to the data and power connectors, removably locating the pallet in a pallet-receiving station in a rack, the pallet-receiving station having a complementary set of data and power contacts which are brought into one-to-one engagement with the set of data and power contacts of the pallet when the latter is located in the pallet-receiving station, and testing and/or installing software onto the system unit by supplying power to the system unit via the power contacts of the pallet-receiving station and supplying data to the system unit via the data contacts of the pallet-receiving station.

As it can be seen, the principal advantages of these embodiments are that they allow the operator to connect both power and data connections from the computer directly to connections on the pallet. An elevator is used to locate the pallet into a docking station elevated above the floor. When the pallet is located in the docking station, power and data connections are automatically made with main power and server, respectively. As a result, two know problems are overcome. Arcing the power contacts on making/breaking the connection causing pitting is avoided by the inclusion of a pre-engaging microswitch. The fixed electrical power contacts only become live after the pallet had been located, thus avoiding exposed live terminals.

Although illustrative embodiments have been shown and described, a wide range of modifications, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A pallet for a personal computer system unit which is to be tested and/or onto which software is to be installed, the pallet having data and power connectors for the system unit and a set of data and power contacts each connected to a respective contact in one of the data and power connectors, the set of data and power contacts being adapted for one-to-one engagement with a complementary set of data and power contacts on a rack upon which the pallet may be located.

2. The system as defined in claim 1, wherein the data and power connectors are sockets.

3. A system for use in testing and/or installing software onto a personal computer system unit, the system including a pallet for the system unit, the system including a pallet for the system unit and a rack having at least one pallet-receiving station for removably accommodating the pallet, wherein the pallet has data and power connectors for the system unit and a set of data and power contacts each connected to a respective contact in one of the data and power connectors, and wherein the pallet-receiving station has a complementary set of data and power contacts adapted for one-to-one engagement with the set of data and power contacts of the pallet when the pallet is located in the pallet-receiving station.

4. The system as defined in claim 3, wherein the pallet-receiving station has guide means for positive location of the pallet in a predetermined position in the pallet-receiving station whereby the set of contacts on the pallet are brought automatically into registering engagement with the complementary set of contacts of the pallet-receiving station as the pallet is brought to the predetermined position.

5. The system as defined in claim 4, wherein the set of contacts on the pallet are downward-facing on the underside thereof and wherein the set of contacts on the pallet-receiving station are upward-facing, and wherein the pallet is lowered into the predetermined position in the pallet-receiving station.

6. The system as defined in claim 4, further including a switch on one of the pallet and pallet-receiving station and a switch actuator on the other of the pallet and pallet-receiving station, the switch being caused to change state as the pallet is brought to the predetermined position only after the sets of contacts have engaged, the switch controlling the power supply to the power contacts of the pallet-receiving station such that power can only be supplied to such contacts after the sets of contacts have engaged.

7. The system as defined in claim 3, wherein the contacts of at least one set of contacts are spring-loaded.

8. The system as defined in claim 3, wherein the rack is adapted to accommodate a plurality of pallets each at a respective pallet-receiving station, each pallet-receiving station having a respective said corresponding set of data and power contacts for engagement with the set of data and power contacts of a respective pallet.

9. A method of testing and/or installing software onto a personal computer system unit, the method including the steps of placing the system unit onto a pallet having data and power connectors for the system unit and a set of data and power contacts each connected to a respective contact in one of the data and power connectors, connecting the system unit to the data and power connectors, removably locating the pallet in the pallet-receiving station in a rack, the pallet-receiving station having a complementary set of data and power contacts which are brought into one-to-one engagement with the set of data and power contacts of the pallet when the latter is located in the pallet-receiving station, and testing and/or installing software onto the system unit by supplying power to the system unit via the power contacts of the pallet-receiving station and supply data to the system unit via the data contacts of the pallet-receiving station.

10. A pallet for testing a computer system comprising:
   a base;
   a socket box mounted on a first side of the base;
   data and power contacts exposed on a second side of the base, opposite the first side;
   a microswitch actuator mounted on the second side of the base; and
   the base having a plurality of locating holes formed therein.

11. The pallet as defined in claim 10 wherein the base includes upturned sidewalls extending therefrom.

12. The pallet as defined in claim 10 wherein the socket box includes a parallel port data socket at a first end and a power socket at a second end.

13. A system for testing and installing software on a computer system comprising:
   a tray;
   a socket box mounted on the tray;
   first data and power contacts mounted on the tray;
   a microswitch actuator mounted on the tray;
   the tray having a plurality of locating holes formed therein;
   a docking station for receiving the tray;
   second data and power contacts on the docking station for engagement with the first data and power contacts;
   guide pins extending from the docking station for engagement with the locating holes; and
   a microswitch mounted on the docking station for engagement with the microswitch actuator.

14. The system as defined in claim 13 wherein the docking station includes guide rails for receiving the tray.

15. The system as defined in claim 13 wherein the second data and power contacts are resiliently biased.

16. The system as defined in claim 13 wherein a power cable is attached to the microswitch for supplying power to the second power contacts upon actuation of the microswitch.

17. The system as defined in claim 13 wherein the tray includes a sheet of foam material for receiving a computer system.

18. A system for testing and installing software on computer system comprising:
   a tray;
   a computer system mounted on the tray;
   a socket box mounted on the tray;
   first data and power contacts mounted on the tray;
   a microswitch actuator mounted on the tray;
   the tray having a plurality of locating holes formed therein;
   a docking station engaging the tray;
   second data and power contacts on the docking station engaging the first data and power contacts;
   guide pins extending from the docking station engaging the locating holes; and
   a microswitch mounted on the docking station engaging the microswitch actuator.

* * * * *